(12) United States Patent
Mathew et al.

(10) Patent No.: US 7,477,171 B2
(45) Date of Patent: Jan. 13, 2009

(54) BINARY-TO-BCD CONVERSION

(75) Inventors: Sanu K. Mathew, Hillsboro, OR (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/729,191

(22) Filed: Mar. 27, 2007

(65) Prior Publication Data
US 2008/0238736 A1  Oct. 2, 2008

(51) Int. Cl.
H03M 7/04 (2006.01)
(52) U.S. Cl. ............... 341/84; 341/85; 708/204; 708/211; 708/625
(58) Field of Classification Search .......... 341/84, 341/85; 708/204, 211, 625, 670, 683
See application file for complete search history.

(56) References Cited

U.S. PATENT DOCUMENTS

| | | | | |
|---|---|---|---|---|
| 3,172,097 A | * | 3/1965 | Imlay ............... | 341/84 |
| 3,500,383 A | * | 3/1970 | Pross, Jr. ........... | 341/84 |
| 3,932,739 A | * | 1/1976 | Lutz et al. .......... | 341/84 |
| 4,069,478 A | * | 1/1978 | Miller ............... | 341/84 |
| 4,245,328 A | * | 1/1981 | Negi et al. ......... | 708/673 |
| 4,325,056 A | * | 4/1982 | Wiener .............. | 341/85 |
| 4,430,643 A | * | 2/1984 | Sevilla .............. | 341/85 |
| 4,799,181 A | * | 1/1989 | Tague et al. ........ | 708/685 |
| 4,805,131 A | * | 2/1989 | Adiletta et al. ..... | 708/685 |
| 5,146,422 A | * | 9/1992 | Maass et al. ........ | 708/670 |
| 5,251,321 A | * | 10/1993 | Boothroyd et al. .. | 341/84 |
| 5,982,307 A | * | 11/1999 | Adachi .............. | 341/84 |
| 6,369,725 B1 | * | 4/2002 | Busaba ............. | 341/84 |
| 2006/0221724 A1 | | 10/2006 | Maheshwari | |
| 2007/0203961 A1 | | 8/2007 | Mathew | |
| 2007/0233760 A1 | | 10/2007 | Mathew | |
| 2007/0233772 A1 | | 10/2007 | Mathew | |
| 2008/0098278 A1 | | 4/2008 | Mathew | |

* cited by examiner

Primary Examiner—Linh V Nguyen
(74) Attorney, Agent, or Firm—Erik R. Nordstrom

(57) ABSTRACT

Disclosed herein are various embodiments of circuitry and methods to convert from a binary value to a BCD value.

15 Claims, 3 Drawing Sheets

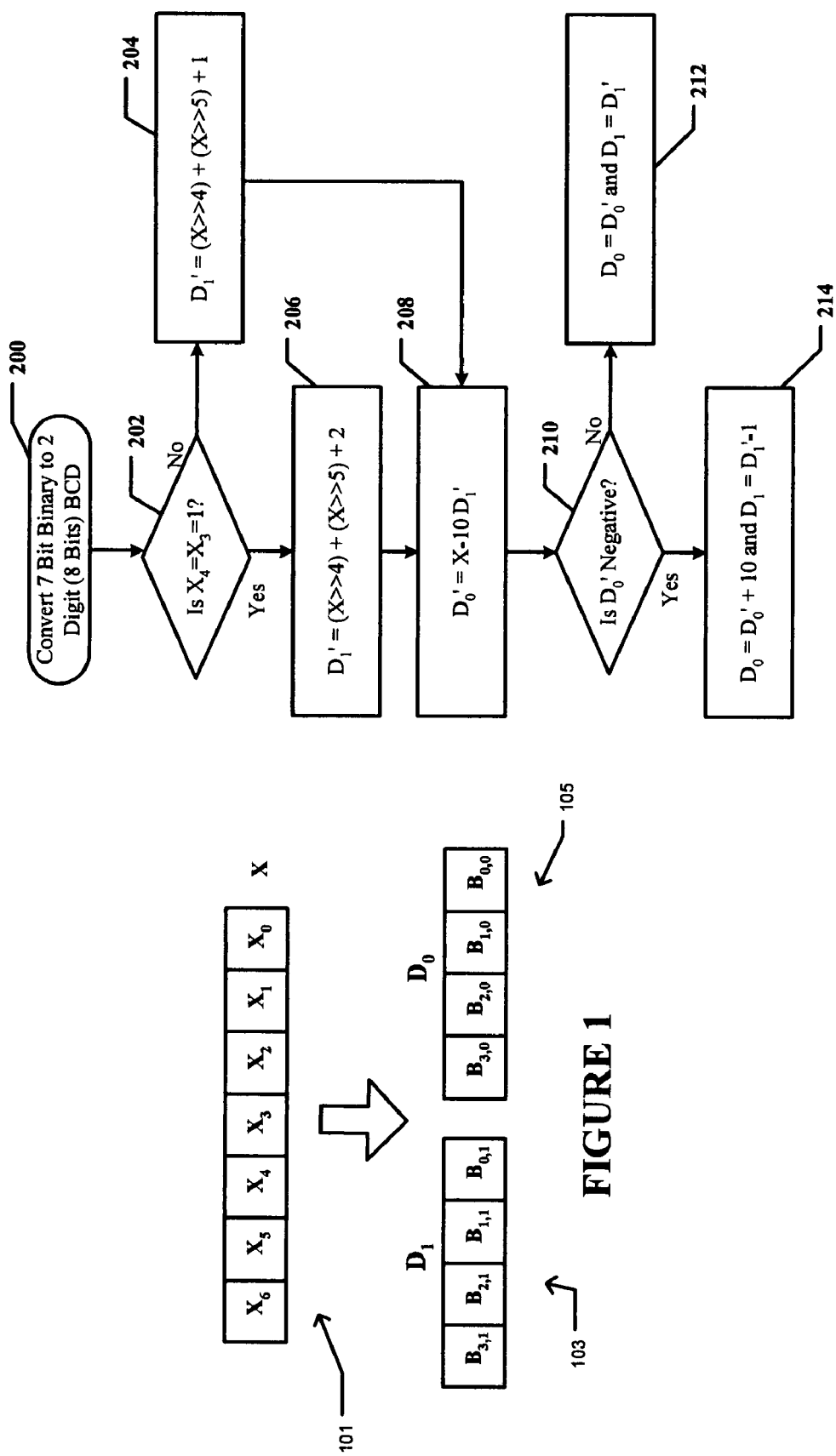

$Sum_i = A_i \oplus B_i \oplus Carry_i$
$Carry_i = A_i \cdot B_i + (A_i + B_i) \cdot Carry_{i-1}$

BINARY-TO-BCD CONVERSION

BACKGROUND

The present invention relates generally to conversion from a binary number to a binary coded decimal (BCD) number.

Present-day processors provide hardware support for binary floating-point computation. While this format is suitable for general-purpose applications, it is typically not well suited for financial, commercial applications because the decimal data cannot be exactly represented with binary floating-point values. That is, binary floating-point numbers can only approximate many decimal numbers. For example, the value (0.1) would need an infinitely recurring binary fraction. In contrast, a decimal number system can represent 0.1 exactly, as one tenth (i.e., $10^{-1}$). Consequently, binary floating-point, in many cases, cannot be used for financial calculations or for any calculations where the results achieved are required to match those which might be calculated by hand. This problem is avoided by using base ten (decimal) exponents and preserving those exponents where possible.

Unfortunately, many existing BCD techniques are inefficient to implement. For example, computation of the digits, $d_n, d_{n-1}, d_{n-2} \ldots d_1, d_0$ is generally done by division of the number by 10, $10^2$, $10^3$, $10^4$ ... etc., with quotient and remainder computations at each stage. These operations are difficult to implement in hardware due to the need for an explicit integer divider. Accordingly, an improved BCD approach is desired.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 1 is a diagram representing conversion of a 7-bit binary value to two, 4-bit binary-coded-decimal (BCD) values.

FIG. 2 is a flow diagram showing a routine for converting a seven-bit binary value to two 4-bit BCD values in accordance with some embodiments.

DETAILED DESCRIPTION

In some embodiments, a recursive approach for implementing binary-to-BCD conversion is presented. A divide and conquer approach may be used by recursively approximating the quotient using divisions by a power of 2, instead of powers of 10. This is easier to implement in hardware and in some embodiments, can have the advantage of lower area, lower power, and higher performance.

FIG. 1 graphically depicts a binary to BCD conversion of a 7-bit binary value X (101) to 2 4-bit BCD values $D_1$, $D_0$ (103, 105). The binary value X has seven bits, $X_0$ to $X_6$, in order from least to most significant bits. The BCD result has two digits, $D_1$ and $D_0$, respectively comprising $D_{3,1}$ to $D_{0,1}$ and $D_{0,3}$ to $D_{0,0}$.

The 7-bit binary number X ranges in decimal terms from 0 to 99. $D_1$ is the quotient of X divided by 10, and $D_0$ is the remainder. It has been discovered that $D_1$ and $D_0$ can be derived in the following manner.

Preliminary values, $D'_1$ and $D'_0$ are initially derived and from there, the final values, $D_0$ and $D_1$, can be found. $D'_1$, equals X/16+X/32+Bias, where the Bias is 2 if $X_3=X_4=1$ or 1 otherwise. Stated differently, $D'_1$ is: X shifted by four bits (X>>4)+X shifted 5 bits (X>>5)+[2 (if $X_3=X_4=1$) or 1 (otherwise)]. $D'_0$ is: X−10 $D_1$. If $D'_0$ is a positive value, then $D_0=D'_0$ and $D_1=D'_1$. On the other hand, if $D'_0$ is negative, then $D_1=D'_1-1$ and $D_0=D'_0+10$.

FIG. 2 shows a routine 200 to implement this approach in accordance with some embodiments. At 202, it determines if the fourth and fifth least significant bits of X ($X_4$ and $X_3$) equal 1. If so, then at 206, $D'_1$ gets (X>>4)+(X>>5)+2. From here, at 208, $D'_0$ gets X+10 $D'_1$. At 210, it is determined if $D'_0$ is negative. If so, then at 214, the final value $D_1$ gets $D'_1-1$ and $D_0$ gets $D'_0+10$.

Figure 3:
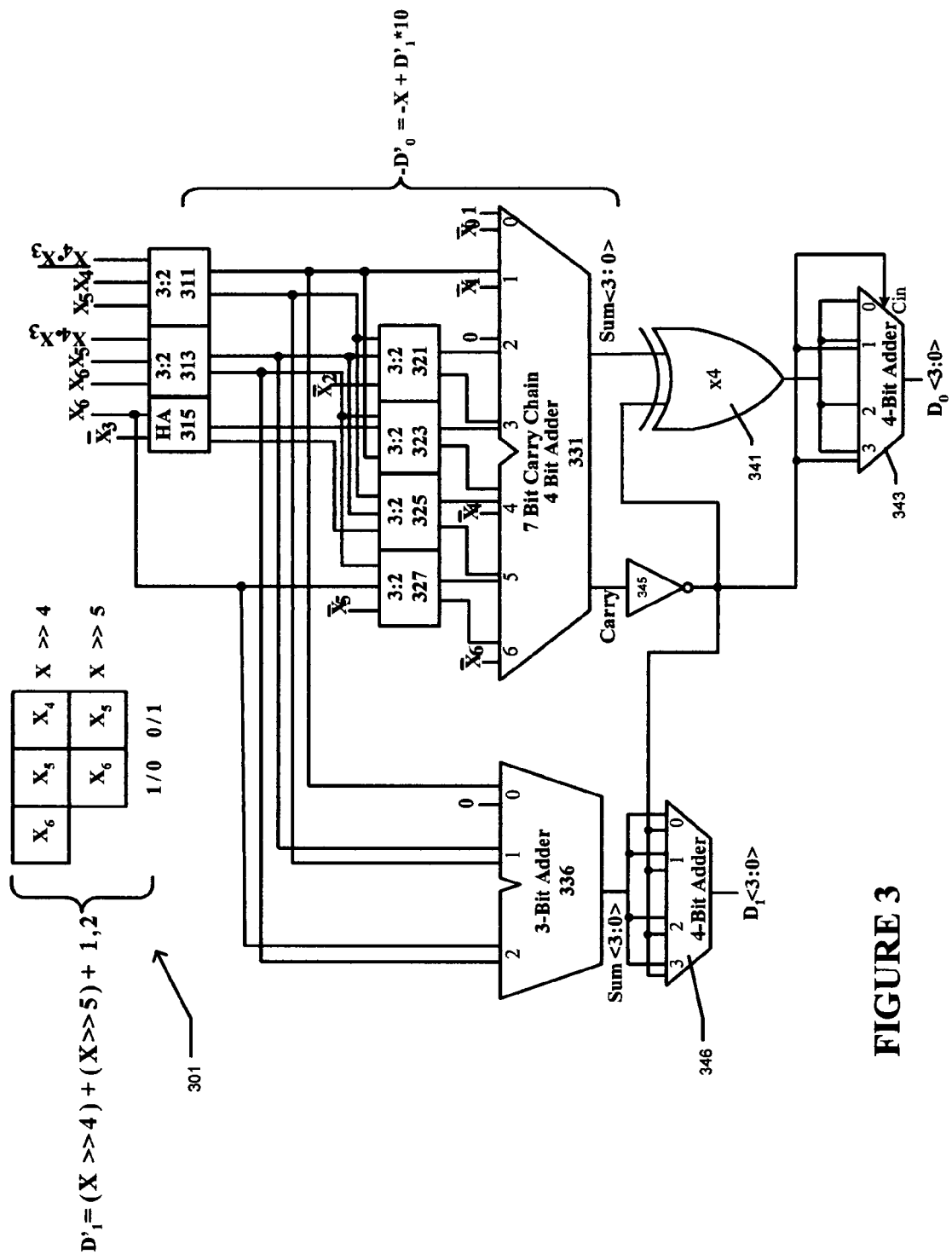
FIG. 3 shows a conversion circuit for implementing the routine of FIG. 2 in accordance with some embodiments.

Returning back to 202, if $X_3$ and $X_4$ are not both equal to '1, then at 204, $D'_1$ instead gets (X>>4)+(X>>5)+1. From here, it goes to 208 and proceeds as just discussed until $D_1$ and $D_0$ are derived. (It should be appreciated that this routine need not be performed exactly, e.g., in the same order as shown in FIG. 2. For example, initial $D'_1$ and $D'_0$ values could be determined prior to determining if $X_4$ and $X_3$ equal '1. Along these lines, this routine could be performed using a variety of different circuits including dedicated arithmetic circuits such as is shown in FIG. 3 or with more general circuits, e.g., general computing circuitry in cooperation with appropriate instructions. Moreover, while this approach converts from a 7-bit binary value X to two 4-bit decimal digits $D_1$, $D_0$, it is not limited to such conversion. for example, larger values, e.g., 64 or 128 bit binary values X could be converted by parsing subp-portions and converting using approaches, whole or in part, presented herein.)

FIG. 3 shows a conversion circuit for converting a 7-bit binary value X to two 4 bit BCD values $D_1$, $D_0$ consistent with the routine of FIG. 2 in accordance with some embodiments. The summing operation to obtain $D_1$ is arithmetically represented at 301. The binary to BCD circuit generally comprises a first row with 3:2 compressors 311, 313 and a half adder 315; a second row with 3:2 compressors 321, 323, 325, 327; a 7-bit carry chain/4-bit adder circuit 331, a 3-bit adder circuit 336, four XOR gates 341, inverter 345, and 4-bit adders 343 and 346, all coupled together as shown.

The input X ($X_0$ to $X_6$) are provided to various inputs as shown. The 3:2 compressors (311, 313) compute $D'_1$, i.e. the sum of X>>4+X>>5+1 or 2 in carry-save format. The sum/carry outputs are provided to 3-bit adder 336 for the ultimate calculation of $D_1$. In addition to outputs from half adder 315, they are also provided to the second row of compressors, which provide their results to the 7-bit carry chain/4-bit summer for the calculation of $D'_0$.

The second row of 3:2 compressors computes 10 $D'_1$ in Carry-Save format. (A decimal multiply by 10 corresponds to X times 1010, which is: X shifted by 1+X shifted by 3.) The 7-bit carry chain/4-bit summer 331 computes a 4-bit-$D'_0$ and a sign-bit (represented by the output Carry).

The 3-bit adder 336 computes D', (corresponding to step 206 in FIG. 2. The Carry bit from carry chain/adder 331 determines if it is correct or whether 1 must be subtracted from it to arrive at $D_1$. The Sum <3:0> output from adder 336 (which corresponds to $D'_1$) is provided to the inputs of adder 346, along with the inverted sign bit thereby leaving it unchanged if the Carry bit is '1 and adding to it '1111 (same as subtracting from it 1) if the Carry bit is '0.

Figure 4:
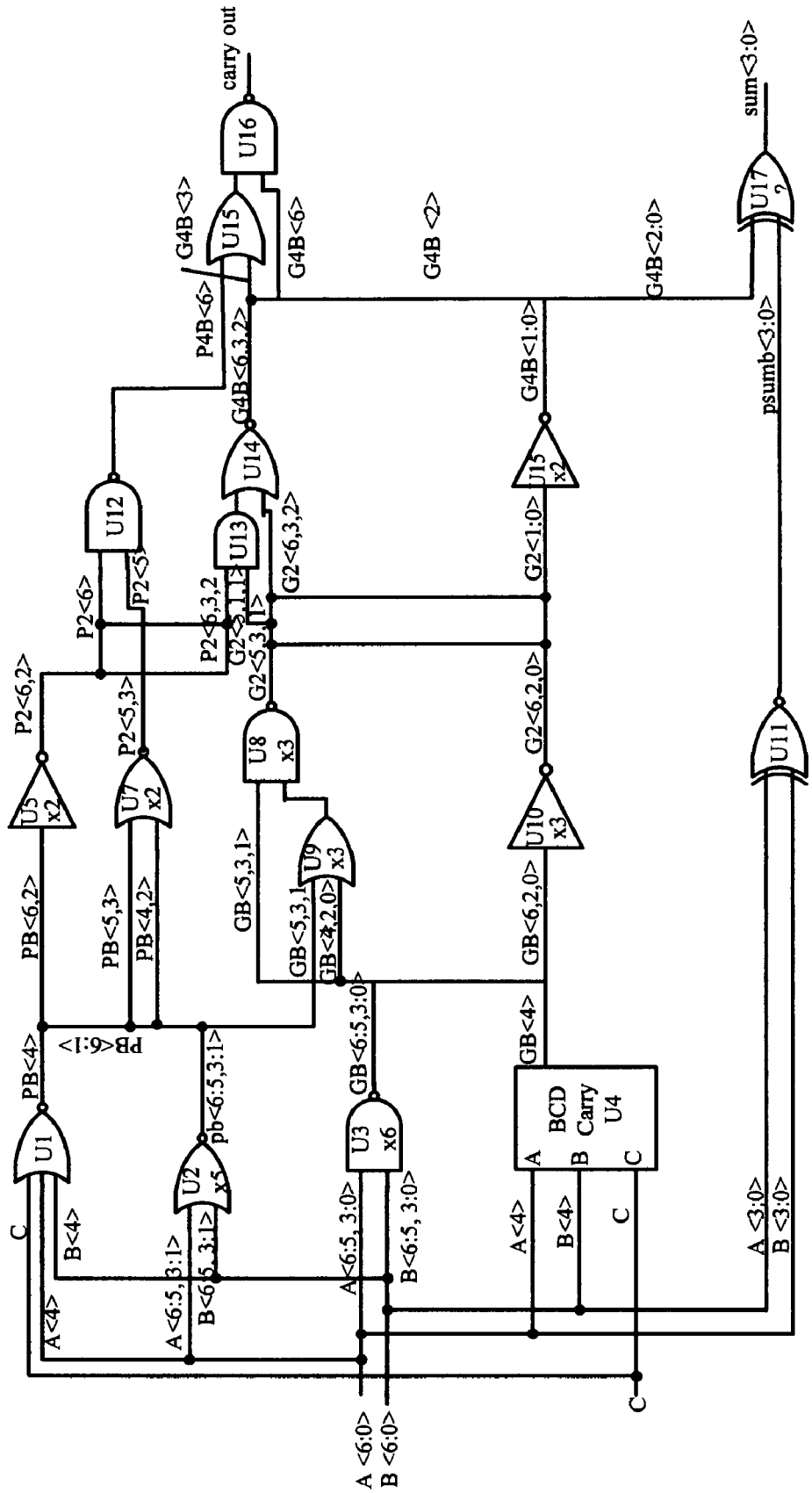
FIG. 4 is a circuit for implementing a seven-bit carry chain merged with a four-bit summer for the circuit of FIG. 3 in accordance with some embodiments.

FIG. 4 shows a circuit to implement the 7-bit carry chain/4-bit adder 331 in accordance with some embodiments. it comprises logic components U1 to U17, coupled together as shown. it comprises a 7-bit carry chain (U1-U10, U12-U16)

merged with a 4-bit summing circuit (U11, U17). (Note that each represented gate is actually implemented with one or more gates, depending on the number of signals being processed. this is indicated with the "x#" nomenclature. Where no "x#" appears, one gate is used.)

The carry-chain adds two 7-bit numbers (A<6:0>, B<6:0>), with an additional bit (C) at bit position 4 (consistent with FIG. 3) to generate an output carry (carry out) at U16. The 7-bit carry-chain uses a radix-2 carry-merge to compute the output carry in 4 gate stages, consistent with the formulas depicted in the lower left portion of the figure. In parallel, the 4-bit sum (sum<3:0> at output of U17) is also computed. The PG block is configured to accommodate the extra bit. In this embodiment, the BCD Carry block U4 computes the $Carry_4$ term, pursuant to the "$Carry_i$" equation in the lower left portion of the figure.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
   conversion circuitry to convert from a 7-bit binary value, X, to first and second 4-bit Binary Coded Decimal values, $D_1$ and $D_0$, the conversion circuitry including summing circuitry to add X right shifted by 4 to X right-shifted by 5 in generating the first Binary Coded Decimal value.

2. The chip of claim 1, in which X comprises, from least to most significant, bits $X_0$ to $X_6$, and the summing circuitry comprises circuitry to add to X right-shifted by 4 summed with X right-shifted by 5 either 1 or 2 depending on whether $X_3$ and $X_4$ are equal to '1, to generate a preliminary first Binary Coded Decimal value $D'_1$.

3. The chip of claim 2, in which the summing circuitry comprises first and second 3:2 compressor circuits.

4. The chip of claim 2, in which the conversion circuitry comprises circuitry to compute a difference between X and $D'_1$ multiplied by 10 to derive a preliminary version $D'_0$ of the second Binary Coded Decimal value.

5. The chip of claim 4, in which the conversion circuitry comprises circuitry to provide $D'_1$ as $D_1$ if $D'_0$ is not negative and to provide $D'_1-1$ as $D_1$ if $D'_0$ is negative.

6. The chip of claim 5, in which the conversion circuitry comprises circuitry to add ten to $D'_0$ if it is negative to provide $D_0$.

7. The chip of claim 6, comprising a 7-bit carry chain merged with a 4-bit adder to provide $D'_0$.

8. A processor chip comprising the conversion circuitry of claim 1.

9. A computer system having the processor chip of claim 8, along with an AC-to-DC power supply to provide power the processor chip.

10. A method to convert from a binary value X, having a plurality of bits ranging from least to most significant, to first and second 4-bit ($D_1$, $D_0$) Binary Coded Decimal digits, comprising deriving D1 by summing X right shifted by 4 with X right shifted by 5 with 1 if the fourth and fifth least significant bits of X are equal to '1; and
   deriving $D_1$ by summing X right shifted by 4 with Xright shifted by 5 with 1 if the fourth and fifth least significant bits of X are not both equal to '1.

11. The method of claim 10, comprising deriving D0 by adding X to the derived D1 first multiplied by ten.

12. The method of claim 11, further deriving $D_1$ by subtracting from it one if the derived $D_0$ is less than zero.

13. The method of claim 12, further comprising further deriving $D_0$ by adding to it ten if it was less than zero.

14. The method of claim 11, in which the act of deriving D1 is part of a method to convert from a binary value larger than X to a Binary Coded Decimal value having more digits than $D_1$ and $D_0$.

15. The method of claim 10, in which summing X right shifted by 4 with X right shifted by 5 with 1 comprises summing them in a 3:2 compressor having as a first input the complement of the fourth and fifth least significant bits of X, having as a second input the fifth least significant bit of X, and having as a third input the sixth least significant bit of X.

* * * * *